United States Patent
Eisert et al.

(10) Patent No.: US 6,768,136 B2
(45) Date of Patent: Jul. 27, 2004

(54) RADIATION EMITTING STRUCTURAL ELEMENT

(75) Inventors: Dominik Eisert, Regensburg (DE);
Uwe Strauss, Bad Abbach (DE);
Johannes Baur, Deuerling (DE)

(73) Assignee: Osram Opto Semiconductors GmbH, Regensburg ( * ) Notice: Subject to any disclaimer, the term of this patent is extended or adjusted under 35 U.S.C. 154(b) by 0 days.

(21) Appl. No.: 10/218,061

(22) Filed: Aug. 12, 2002

(65) Prior Publication Data

US 2003/0155580 A1 Aug. 21, 2003

(30) Foreign Application Priority Data

Aug. 14, 2001 (DE) .......................................... 101 39 798

(51) Int. Cl.[7] .............................................. H01L 33/00
(52) U.S. Cl. ............................................ 257/98; 257/95
(58) Field of Search ...................................... 257/98, 95

(56) References Cited

U.S. PATENT DOCUMENTS 5,087,949 A * 2/1992 Haitz ........................... 257/79
5,218,223 A * 6/1993 Spaeth et al. ................ 257/436
5,349,211 A * 9/1994 Kato ............................ 257/90

FOREIGN PATENT DOCUMENTS

DE      24 16 098 A1    10/1975
DE      100 06 738 A1    9/2001

* cited by examiner

Primary Examiner—Jerome Jackson
(74) Attorney, Agent, or Firm—Fish & Richardson P.C.

(57) ABSTRACT

A radiation-emitting structural element with a multi-layer structure, which includes an active layer with at least one radiation-generating surface, and a radiation-permeable window with a main surface, on which the multi-layer structure is placed.

26 Claims, 7 Drawing Sheets

RADIATION EMITTING STRUCTURAL ELEMENT

BACKGROUND OF THE INVENTION

The invention relates to a radiation-emitting structural element with a multilayer structure.

Radiation-emitting structural elements in the prior art have a multi-layer structure with an active layer serving to generate radiation, as well as a radiation-permeable window with a main surface, on which the multi-layer structure is placed. A window in the form of a cube or cuboid is often used in conventional structural elements.

In this form of window, a comparatively large portion of the generated radiation is totally reflected at the interface between the window and the environment, thereby reducing the decoupling of the generated radiation.

In an improved form, the window is bordered, by at least one lateral surface, which has a partial surface set at an angle to the main surface. A corresponding shape of window is schematically depicted in longitudinal section in FIG. 7.

SUMMARY OF THE INVENTION

Figure 7:
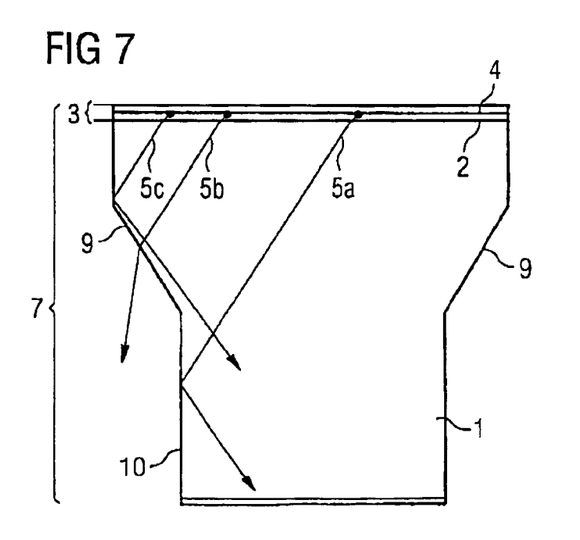
FIG. 7 depicts a schematic section view showing a base structure that is improved by the invention.

In the structural element depicted, a multi-layer structure 3 is placed on a main surface 2 of a window 1, which structure comprises a radiation-generating active layer 4. The radiation generated in the active layer 4 and emitted in the direction of the window 1 is depicted, for illustrative purposes, by rays 5*a*, 5*b*, and 5*c*. These rays enter the window 1 through the main surface 2, pass through part of the window 1, and finally reach the peripheral surface of the window 1. Depending on the angle of incidence to the peripheral surface, a ray is decoupled as in the case of ray 5*b*, or totally reflected as in the case of 5*a*, 5*c*. Total reflection occurs when the angle of incidence, relative to the planar normal of the peripheral surface, is greater than the total angle of reflection.

In the structural element depicted, the window is bordered by lateral surfaces 7, each of which has a partial surface 9 proceeding at an angle relative to the main surface 2. As a result of the angled position, the angle of incidence of the ray 5*b* striking the partial surface 9 is decreased, thus reducing the proportion of totally reflected radiation and significantly increasing the overall radiation yield.

The task of the invention is to create a radiation-emitting structural element of the type described initially but with improved radiation yield. In particular, the task of the invention is to specify a structural element having high decoupling efficiency. Advantageous embodiments of the invention are the object of the dependent claims.

The idea of the invention is to limit, in a structural element of the prior art, the generation of radiation to areas in which especially high radiation decoupling occurs.

Such spatially limited generation of radiation can be accomplished by providing the active layer with high radiation decoupling in the specified areas only. In addition, the active layer can also extend across larger areas, so that, by additional means, such as a spatially limited impression of operating current, radiation is generated only in portions of the active layer. The radiation-emitting surfaces of the active layer that are in operation are referred to below as "radiation-emitting surfaces." In contrast, the active layer is the layer formed within the multi-layer structure, which is fundamentally suitable for generation of radiation.

Provision is made according to the invention for formation of a radiation-emitting structural element with a multilayer structure that has an active layer with a radiation-generating surface and a radiation-permeable window with a main surface, on which the multi-layer structure is placed. The window is bordered by a lateral surface with a first partial surface arranged perpendicular to the main surface, and a second, curved or stepped partial surface proceeding at an angle to the main surface, wherein the first partial surface merges into the second partial surface at a distance d from the main surface. The radiation-generating surface has a lateral border created, at a distance 1, from a first partial surface perpendicular to the main surface and from the edge formed by the main surface, to which the following applies:

$$1 \geqq d/\tan\beta, \text{ where } \beta = \arccos n_1/n_2,$$

where $n_1$ refers to the refractive index of the multi-layer structure and $n_2$ to the refractive index of the window, which is larger than the refractive index $n_1$ of the multi-layer structure.

As a result of this spacing of the radiation-emitting surface from the corresponding edge of the window, the portion of the radiation that strikes the first partial surface, which is perpendicular to the main surface, is decreased relative to the portion of the radiation that strikes the second partial surface, which is perpendicular to the main surface, thereby increasing radiation decoupling.

In a preferred embodiment of the invention, a third partial surface, set perpendicular to the main surface, is joined to the second, stepped or curved partial surface, which proceeds at an angle to the main surface. As a result, a base with lateral surfaces orthogonal to one another can be formed on the side of the structural element facing away from the multi-layer structure, which base is advantageous in terms of assembly of the structural element. Many existing assembly machines, especially automatic, are designed for such window shapes with orthogonal lateral surfaces and, advantageously, can also be used to some extent with this embodiment of the invention.

The radiation-generating surface is preferably recessed into an area that overlaps the window base perpendicular to the main surface, so that no radiation is generated in this area. Radiation that would be generated here would essentially be emitted in the direction of the window base, where it would be decoupled to a significantly lesser extent than at the second, angled partial surface of the lateral surface.

In an advantageous embodiment of the invention, the window has a lateral profile in the shape of a rectangle, a square, or a triangle. Here, a lateral profile is understood to mean a profile with a section plane parallel to the main surface.

More preferably, the window is bordered by a second main surface opposite and parallel to the first main surface. This configuration is advantageous, especially when the window is manufactured from a larger, planar substrate by means of sawing or breaking.

In the invention, the radiation-generating surface can comprise a plurality of radiation partial surfaces. The radiation partial surfaces are preferably arranged in the areas of the active layer in which high decoupling occurs, with the areas between the individual radiation partial surfaces reserved for low decoupling. The radiation partial surfaces are preferably framed by two or more of the aforementioned borders, and are thus characterized by especially high decoupling of the generated radiation.

In an advantageous embodiment of the invention, the window has two opposing partial surfaces, each having a first partial surface perpendicular to the main surface, with each of these first partial surfaces merging into a second, stepped or curved partial surface proceeding at an angle to the main surface. As a result of this plurality of angled partial surfaces, decoupling is advantageously increased even further. In addition, the window can also be laterally bordered on all sides by lateral surfaces with a first partial surface perpendicular to the main surface, and a second partial surface proceeding at an angle to the main surface.

Preferably, an electrical contact surface is installed on the multi-layer structure. A corresponding opposing contact surface can, for example, be installed on the side of the window facing away from the multi-layer structure. These contact surfaces serve to provide electric power to the structural element.

To form a limited radiation-emitting surface in the active layer, the contact surface installed on the multi-layer structure can be structured to correspond to the shape of the radiation-emitting surface. When current flows essentially perpendicular to the main surface, a current is introduced into those areas of the active layer that are concealed from view by the contact surface. As a result, radiation is generated only in the areas of the active layer through which current flows. Thus, by means of an electric current, the contact surface is so to speak projected onto the active layer.

In this case, the active layer can be advantageously formed to be laterally homogeneous. This facilitates production of the multi-layer structure, as structuring of the active layer is not necessary. The structuring of a contact surface generally requires little effort. Thus, the contact surface can, for example, be initially applied in a laterally homogeneous manner by vacuum metallization, and then can be structured by etching or sputtering.

Alternatively, or in addition, the multi-layer structure can have lateral peripheral surfaces that are essentially perpendicular to the main surface and simultaneously form the border of the radiation-generating surface. The structuring of the multi-layer structure required for this purpose can be accomplished by etching, for example.

In an advantageous further enhancement of the invention, the multi-layer structure comprises a radiation-generating pn-transition, which is composed of at least one p-conducting and at least one n-conducting layer. Thus, the structural element can be formed as a luminescence diode, such as an LED. In addition to being a transition formed by direct contact between the p-conducting and the n-conducting layer, a pn-transition can also refer to a transition in which the p-conducting layer is not directly adjacent to the n-conducting layer, as is the case, for example, in quantum pot structures.

In this process, the border of the radiation-emitting surface can be established by removing the p-conducting or the n-conducting layer from those areas in which no radiation is to be generated, so that no radiation-generating pn-transition is formed there. This removal can be accomplished by etching, for example.

Another method of delimitation consists in compensating p-conductivity or n-conductivity from area to area, so that a pn-transition does not also exist in those areas of the active layer in which no radiation is to be generated. Compensation of conductivity is achieved, for example, by insertion of particles of the opposing mode of conductivity.

In the invention, the multi-layer structure preferably contains GaN-based semiconductor connections. These are defined, in particular, as GaN, AlGaN, InGaN, and AlInGaN. Such connections are characterized by a high level of quantum efficiency and facilitate, particularly as a result of their comparatively large energy gap, the generation of radiation in the green, blue and ultraviolet spectral range.

A GaN-based multi-layer structure is preferably manufactured epitaxially. SiC substrates or GaN substrates, for example, are suitable as epitaxial substrates. Sapphire substrates can also be used. In the invention, the window can advantageously be manufactured from the epitaxial substrate. In this case, an SiC window is characterized by its electrical conductivity, which facilitates the formation of a vertically conductive structural element, as well as by its radiation-permeability for the generated radiation. Vertically conductive structural elements are comparatively easy to bond, and permit homogeneous current distribution in the structural element.

Additional features, advantages and useful attributes of the invention are explained below on the basis of eleven exemplary embodiments, in connection with FIGS. 1 to 7.

BRIEF DESCRIPTION OF THE SEVERAL VIEWS OF THE DRAWINGS

FIG. 5a depicts the degree of decoupling of a tenth exemplary embodiment of a structural element of the invention, depicted schematically from above in FIG. 5b and schematically in section in FIG. 5c, as a factor of a dimension of the radiation-generating surface.

DETAILED DESCRIPTION OF THE INVENTION

Identical or identically acting elements are identified by the same reference symbols in the figures.

Figure 1:
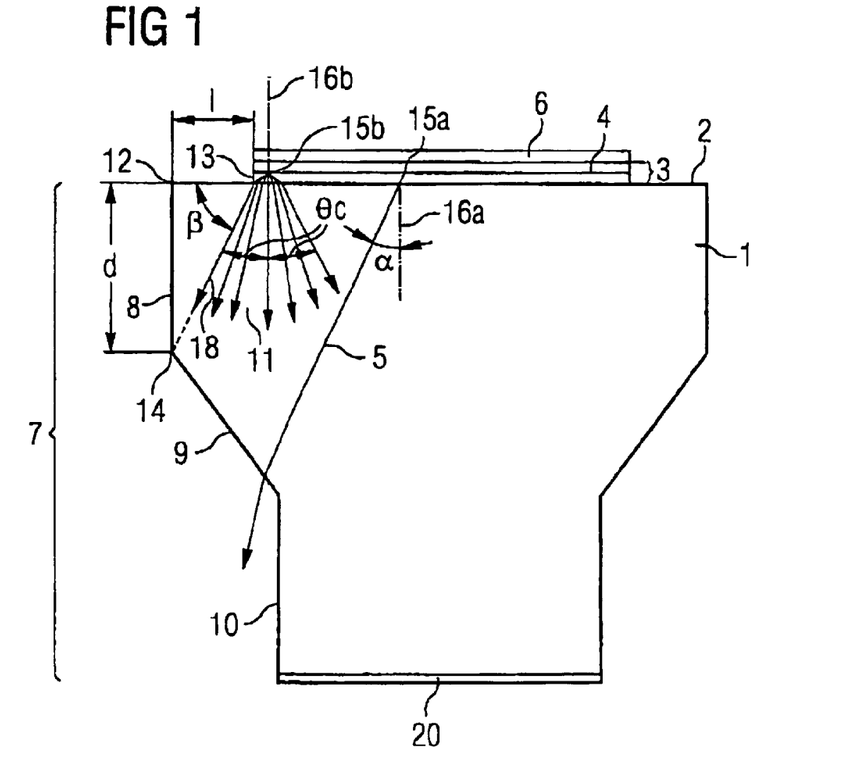
FIG. 1 depicts a schematic sectional view of a first exemplary embodiment of a structural element of the invention.

The structural element depicted in section in FIG. 1 comprises a window 1 with a main surface 2, on which a multi-layer structure 3 is constructed. The multi-layer structure 3 contains a radiation-generating active layer 4, and is provided with a contact surface on the side facing away from the window 1. Opposite the contact surface 6, an opposing contact surface 20 consisting of an electrically conductive material, such as SiC, is applied to the window.

A lateral surface 7 extending between the main surface 2 and the opposite side of the window has a first partial surface 8, which is set perpendicular to the main surface 2. A second partial surface 9 proceeding at an angle to the main surface 2 is joined to the first partial surface 8, and is in turn joined to a partial surface 10 perpendicular to the main surface 2.

As is directly evident in FIG. 1, the angle of incidence of a light beam 5 emitted by the active layer 4 in the direction of the lateral surface 7 is smaller when the light beam strikes the lateral surface 7 in the area of the inclined, second partial surface 9 than when it strikes the partial surfaces 8 or 10, which are perpendicular to the main surface 2. As a result, the partial surface 9 proceeding at an angle relative to the main surface 2 enjoys a higher degree of decoupling. In particular, the total reflection of the generated radiation in the area of the partial surface 9 is more substantially reduced at the lateral surface than at the adjacent partial surfaces 8 and 10.

The multi-layer structure 2 is laterally bordered in such a way as to prevent the generated radiation striking the vertical partial surface 8 in a manner detrimental to decoupling. To this end, the multi-layer structure 2, the refractive index $n_1$ of which is smaller than the refractive index of the window $n_2$, is positioned at a distance from the edge 12 formed by the main surface and the vertical first partial surface 8. The distance 1 between the lateral peripheral surface 13 of the multi-layer structure and the edge 12 depends on the distance between the main surface 2 and the transition 14 between the first, vertical partial surface 8 and the second, inclined partial surface 9, wherein the following applies $$1 \geq d/\tan \beta, \text{ where } \beta = \arccos n_1/n_2.$$

This condition is referred to below as the decoupling condition. It results from the following relationship:

Upon entering the window 1, which represents a transition into a more optically dense medium, a light ray 5 emitted by a luminous spot 15a in the active layer 4 is refracted in the direction of the vertical 16a of the main surface 2. The angle $\alpha$ between the vertical 16a and the light ray 5 is smaller than the critical angle $\theta_c$. The critical angle $\theta_c$ corresponds to the critical angle of total reflection for the reverse transition from the window to the multi-layer structure, and is defined by $$\sin \theta_c = n_1/n_2$$

Consequently, a beam cluster emitted by a luminous spot 15b is converted in the substrate into a ray beam 11 with an aperture angle $2\theta_c$. The peripheral ray 18 laterally bordering the ray beam 11 completes an angle $\theta_c$ with the vertical 16b.

The radiation-emitting surface in the active layer is therefore now bordered in such a way that no radiation from this ray beam 11 directly strikes the partial surface 8 in a manner unfavorable to decoupling. This condition is met if, as illustrated by the luminous spot 15b shown in FIG. 1, the luminous spot 15b is spaced at a sufficient distance from the edge 12 to enable the peripheral ray 18 of the ray beam 11 that faces the lateral surface 7 to strike the transition 14 between the vertical partial surface 8 and the inclined partial surface 9. If the distance between the luminous spot 15b and edge 12 is smaller, a portion of the radiation emitted by the luminous spot will strike the partial surface 8.

The borderline case described above, in which the peripheral ray 18 strikes the transition 14, results in the relationship $$d/l = \tan \beta, \beta = 90° - \theta_c,$$

from which the following decoupling condition results, which is applicable to the distance between the edge of the radiation-emitting surface and the edge 12 formed by the partial surface 8 and the main surface 2:

$$1 \geq d/\tan \beta, \text{ where } \beta = \arccos(n_1/n_2).$$

It should be noted that, in the above calculation, the path of the rays in the area of the multi-layer structure between the active layer 4 and the main surface 2 was ignored. In other words, it was assumed that this area of the multi-layer structure is negligibly small. Consequently, the above calculation is only an approximation, and is adequate for structural elements in which the thickness of the multi-layer structure is clearly smaller than the distance d.

Figure 2:
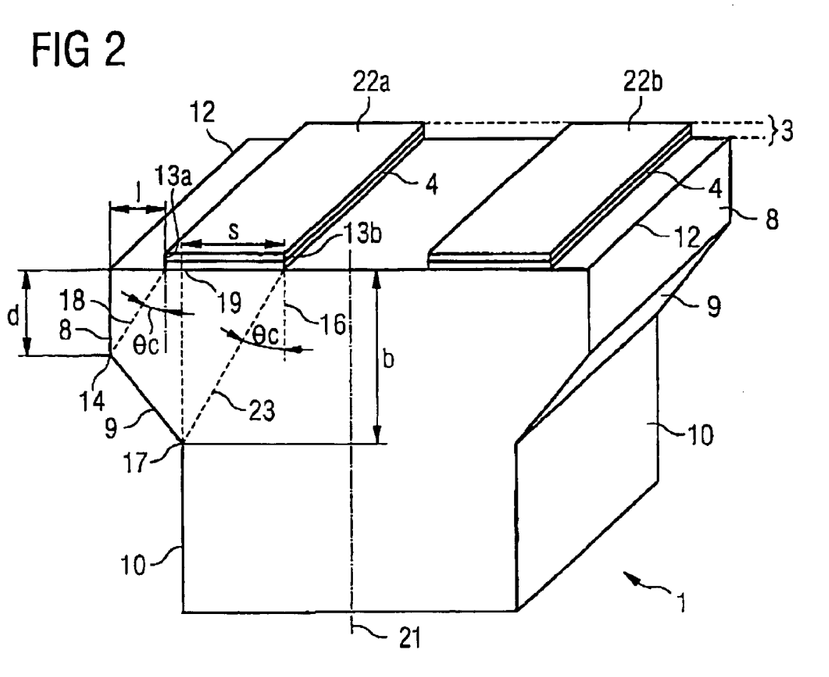
FIG. 2 depicts a schematic perspective sectional view of a second exemplary embodiment of a structural element of the invention.
Figure 3:
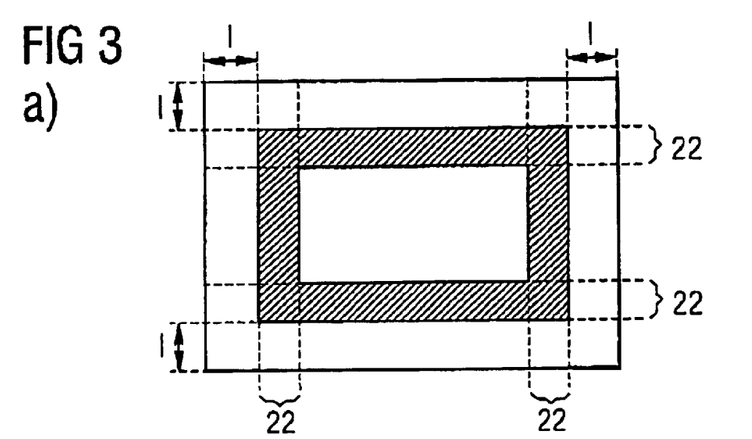
FIGS. 3a to 3f. Each depicts a schematic view from above of six additional exemplary embodiments of a structural element of the invention.

An enhancement of the previous exemplary embodiment is depicted in FIG. 2. In this case, the radiation-emitting surface has a first border formed by the lateral peripheral surfaces 13a of the multi-layer structure, which is placed at a distance 1 from the edge 12 and fulfills the decoupling condition.

The radiation-emitting surface is also bordered toward the center axis 21 of the chip by a further lateral peripheral surface 13b of the multi-layer structure 3, so that the radiation-emitting surface is recessed in an area reserved for it over the window base in the direction of the center axis. Radiation generated in this area would essentially be emitted in the direction of the window base and not onto the inclined surfaces 9. As the side of the window opposite the multi-layer structure can also serve as a mounting surface, only a small portion of the radiation striking the area of the window base is decoupled. Therefore, in the interest of achieving a high degree of decoupling, it is advantageous to limit the generation of radiation to the edge sections of the multi-layer structure.

A relationship analogous to the decoupling condition applies to the border of the radiation-emitting surface relative to the center axis 21. In this relationship, the edge 12 is replaced by the intersection line 19, which is determined by the intersection of the main surface 2 with the third partial surface 10 or its extension in the direction of the main surface 2. The distance d is replaced by the distance b of the transition 17 between the second partial surface 9 and third partial surface 10 and the main surface 2. The ray 23 coming from the border of the radiation-emitting surface corresponds to the peripheral ray 18, and runs in parallel to it (for reasons of clarity, the ray beams corresponding to peripheral rays 18 and 23 are not depicted). The distance s between the border 13b of the radiation-emitting surface and the intersection line 19 preferably fulfills the following relationship:

$$s \leq b/\tan \beta, \text{ where } \beta = \arccos n_1/n_2$$

This condition ensures that at least a portion of the generated radiation strikes the inclined partial surface 9.

In the exemplary embodiment depicted, the radiation-emitting surface is structured in the form of two strips 22a, 22b, which proceed in parallel to the respective edges 12 of the window formed by the main surface 2 and the first partial surface 8, which is perpendicular to the main surface 2. The structural element is preferably designed to be symmetrical to the center axis 21.

Views from above of six exemplary embodiments of the invention are depicted in FIGS. 3a to 3f. The exemplary embodiments differ in terms of the shape of the radiation-emitting surface, which is indicated by cross-hatching in each figure. The corresponding windows have, in longitudinal section, a shape corresponding to FIG. 2, and are bordered on all sides by lateral surfaces that have a first partial surface perpendicular to the main surface 2 and a second partial surface proceeding at an angle relative to the main surface 2. In the exemplary embodiments depicted in FIGS. 3a to 3c, the window essentially corresponds to the perspective view shown in FIG. 4.

As explained in connection with FIG. 2, it is advantageous to structure the radiation-emitting surface as strips arranged in parallel to an edge 12 formed by the first partial surface and the main surface. In the third, fourth and fifth exemplary embodiments, as depicted in FIGS. 3a, 3b and 3c, this results in four strips 22, each of which proceeds in parallel to and at a distance from an edge 12 of the window.

In the configuration of the radiation-emitting surface shown in FIG. 3a, these strips 22 are joined to make a frame, which is surrounded on all sides by a space 1 extending to the nearest window edge 12, with said space fulfilling the decoupling condition.

In the exemplary embodiment depicted in FIG. 3b, however, only those areas in which the strips 22 overlap are configured as radiation-emitting surfaces. Because of the proximity of each of these overlapping areas to two angled partial surfaces, they enjoy an especially high degree of decoupling. The radiation-emitting surfaces are, in turn, positioned at a distance from the edges 12 of the window 1, with the distance 1 fulfilling the decoupling condition.

The exemplary embodiment depicted in FIG. 3c represents a combination of the form of the radiation-emitting surface shown in FIGS. 3a and 3b. As in the exemplary embodiment shown in FIG. 3b, the overlapping areas of the strips 22 are structured as a radiation-emitting surface, but with additional narrower strips of radiation-emitting surfaces connecting these overlapping areas. The higher degree of decoupling applied to the overlapping areas is taken into account by the stronger emphasis placed on these areas.

The exemplary embodiments shown in FIGS. 3d to 3f correspond to the exemplary embodiments shown in FIGS. 3a to 3c, except that here the window has a triangular lateral profile. This triangular profile leads to further reduction of the total reflection in the window, so that the radiation yield is increased even further.

In this case, a lateral profile in the shape of an equilateral triangle, such as that depicted in FIG. 3d, or a right triangle, such as that depicted in FIG. 3e, is preferred. In FIG. 3d, three strips correspond to the four strips 22 in FIGS. 3a, 3b and 3c, with each of said three strips proceeding in parallel to and at a distance 1 from each edge 12 of the window, which fulfills the decoupling condition.

In FIG. 3e, in a manner similar to that depicted in FIG. 3b, the radiation-emitting surface is composed of several partial radiation surfaces, each of which is arranged in proximity to one corner of the window. These partial radiation surfaces are framed by two borders, which are set at a distance 1 from the nearest window edge 12, which fulfills the decoupling condition. The exemplary embodiment depicted in FIG. 3f represents, similarly to that shown in FIG. 3c, a combination of the exemplary embodiments shown in FIGS. 3d and 3e, with the partial radiation surfaces being joined by narrower radiation-emitting strips. The distance 1 between these strips and the nearest window edge 12 likewise fulfills the decoupling condition.

As already described several times, the configuration and structuring in particular of the radiation-emitting surface is critical to the invention. This structure can be determined by the lateral profile of the multi-layer structure. To this end, for example, the multi-layer structure is initially applied across the entire main surface of the window. Then those areas are selectively removed in which no radiation is to be generated. The selective removal can be accomplished, for example, by etching. The advantage of this method of structuring the radiation-emitting surface is that the shape of the radiation-emitting surface can be selected essentially at will by using, for example, a suitable etching mask.

Another way to limit the radiation-emitting surface consists in impressing the current in such a way that current flows only to those parts of the active layer that are part of the radiation-emitting surface. This can be accomplished, for example, by constructing a contact surface in the form of a radiation-emitting surface, which is applied to the multi-layer structure. In this case, the flow of current is essentially vertical, i.e., perpendicular to the layer plane of the multi-layer structure, thereby projecting the contact surface onto the active layer.

Another possibility for laterally limiting current introduction into the active layer consists in electrically insulating the multi-layer structure at those points where no radiation is to be generated. To this end, for example, a suitably shaped mask made of an electrically insulating material can be applied to the multi-layer structure and covered with contact metal coating.

A portion of the multi-layer structure can also be converted into an electrically insulating material. This variant is especially suitable for a multi-layer structure that comprises a p-conducting and an n-conducting layer to form a radiation-generating pn-transition. The electrical conductivity of such layers can be compensated and therefore reduced by incorporating particles of the respective opposite conductivity type. Thus, for example, the multi-layer structure can be have a pn-transition with elimination of p-conductivity at those points that do not correspond to the radiation-emitting surface and at which, therefore, no radiation is to be generated.

Another means of limiting the active surface using a laterally limited pn-transition consists in removing the p-conducting or n-conducting layer at those points at which no radiation is to be generated. An etching process, for example, is suitable for this purpose.

Figure 4:
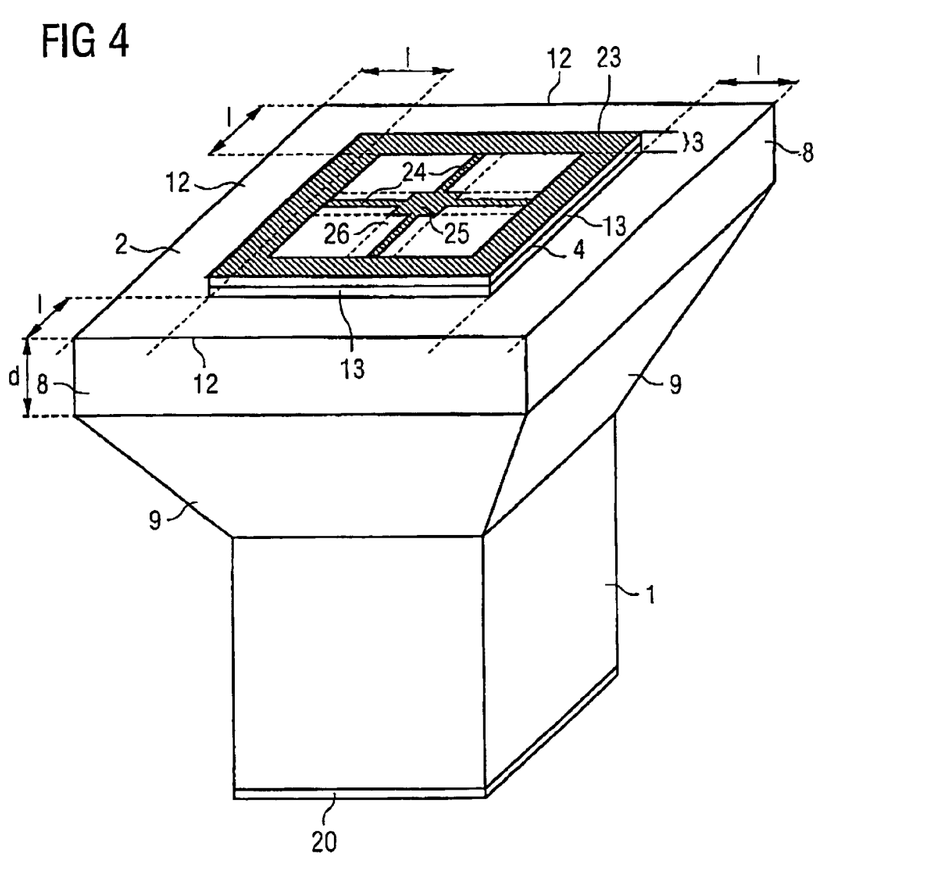
FIG. 4 depicts a schematic perspective view of a ninth exemplary embodiment of a structural element of the invention.

Another exemplary embodiment of the invention is depicted in FIG. 4. Here the window has a longitudinal profile corresponding to FIG. 1 and is bordered by for lateral surfaces, each of which is composed of a first partial surface 8 perpendicular to the main surface 2, a second partial surface 9 joined to it and proceeding at an angle to the main surface 2 and, joined to this second partial surface, a third partial surface 10 perpendicular to the main surface 2.

A multi-layer structure 3 comprising an active layer 4 in the form of pn-transition, with the p-conducting side facing away from the window, is applied to the main surface 2 of the window. The multi-layer structure is spaced on all sides from the edges 12 of the main surface, so that the distance 1 between the lateral peripheral surface 13 of the multi-layer structure and the corresponding parallel edge 12 of the window fulfills the decoupling condition.

To form a frame-shaped radiation-emitting surface corresponding to that depicted in FIG. 3a, a contact frame in the form of a frame-like contact metal coating 23 is applied to the multi-layer structure. The contact metal coating is preferably designed to be radiation-permeable. Branch cables 24 proceed from the contact frame to a common central hub with a wired surface 25. A suitable wire contact through which operating current is supplied can be connected here. To prevent current from flowing into the active layer via the branch cables 24 and the hub surface 25, the areas 26 located beneath the branch cables and the hub surface are electrically insulated. In these areas 26, the p-conductivity of the upper layer of the pn-transition was eliminated. As a result, electrical conductivity is lowered and, additionally, the pn-transition impaired, so that essentially no radiation is generated in these areas.

In FIG. 5a, the decoupling efficiency Q, i.e., the decoupled radiation relative to the total radiation generated for a structural element according to FIG. 4, is depicted as a factor of the expansion of the radiation-emitting surface. The dimensions of the window are clarified by the view from above of the main surface shown in FIG. 5b and the sectional view shown in FIG. 5c. The decoupling [efficiency] Q was calculated for a window with a square main surface and an edge length of a=600 μm (see FIG. 5b) and for a frame-shaped radiation-emitting surface with a frame width b=20 μm. The decoupling [efficiency] is plotted against the frame size x in FIG. 5a. Line 27 or the measuring points found there refer to a window in which the second, inclined partial surface 9 and the first partial surface 8, which is perpendicular to the main surface 2, complete an angle δ=45°, and in which the distance q between the first partial surface 8 and the third partial surface 10 comprises 100 μm (see FIG. 5c). Line 28 and the measuring points found there were calculated for δ=30° and q=60 μm. In both cases, as the frame size x decreases the decoupling efficiency Q initially increases substantially, reaches a maximum at approximately 43%, and then decreases again as the frame size decreases further. The range 29 indicates a preferred range for the frame size, with the upper limit of this range, where x=530 μm, corresponds to the minimum distance between the radiation-emitting surface and the window edge, which is determined by the decoupling condition.

Figure 5:
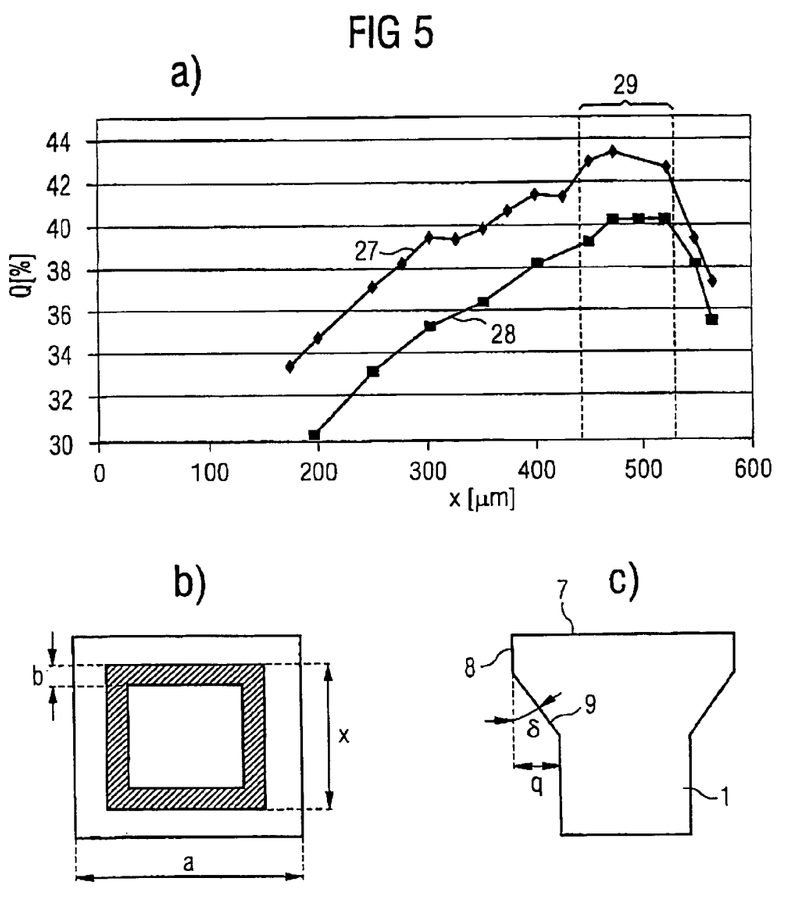
Figure 6:
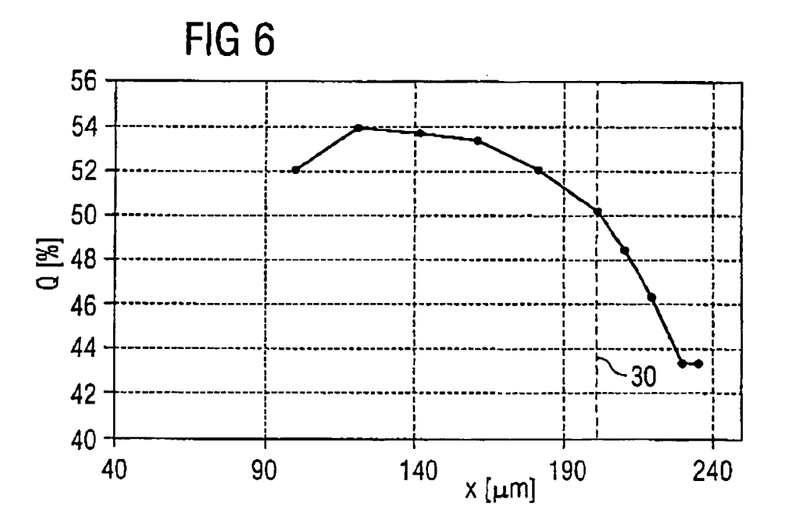
FIG. 6 depicts the degree of decoupling of an eleventh exemplary embodiment of a structural element of the invention as a factor of a dimension of the radiation-generating surface.

The decoupling efficiency for a similar structural element is depicted in FIG. 6. With an edge length of a=280 μm, the main surface is significantly smaller, while the inclined partial surface 9 is determined by the parameters δ=30° and q=60 μm. The radiation-emitting surface is in turn frame-shaped, with a frame width b=20 μm. As in FIG. 5, the decoupling efficiency Q is plotted against the frame size x. Again, there is a significant increase in decoupling efficiency as the frame size x decreases, with the line 30 marking the limit set by the decoupling condition.

Naturally, the explanation of the invention on the basis of the exemplary embodiments is not to be interpreted as a restriction of the invention to these embodiments.

What is claimed is:

1. A radiation-emitting structural element with a multi-layer structure, which comprises an active layer with at least one radiation-generating surface, and a radiation-permeable window with a main surface, on which the multi-layer structure is placed, characterized in that
    the window has a lateral surface with a first partial surface arranged perpendicular to the main surface, and a second, curved or stepped partial surface proceeding at an angle to the main surface,
    wherein the first partial surface forms an edge with the main surface and merges into the second partial surface (9) at a distance d from the main surface, and that the radiation-generating surface has a lateral border,
    which is arranged at a distance l from the edge formed by the first partial surface and the main surface, to which the following applies:

$l > d/\tan\beta$, where $\beta = \arccos n_1/n_2$, where $n_1$ refers to the refractive index of the multi-layer structure and $n_2$ to the refractive index of the window, and the refractive index $n_1$ of the multi-layer structure is smaller than the refractive index $n_2$ of the window.

2. Radiation-emitting structural element according to claim 1, characterized in that
    a third partial surface perpendicular to the main surface is joined to the second, stepped or curved partial surface, which proceeds at an angle to the main surface.

3. Radiation-emitting structural element according to claim 1, characterized in that
    a profile of the window parallel to the main surface has the shape of a rectangle, a square or a triangle.

4. Radiation-emitting structural element according claim 1, characterized in that
    the radiation-emitting surface is composed of several partial radiation surfaces.

5. Radiation-emitting structural element according to claim 1, characterized in that
    the window has two opposing lateral surfaces, each having a first partial surface perpendicular to the main surface and a second, stepped or curved partial surface proceeding at an angle to the main surface.

6. Radiation-emitting structural element according to claim 5, characterized in that
    each lateral surface of the window has a first partial surface perpendicular to the main surface, and a second, curved or stepped partial surface proceeding at an angle to the main surface.

7. Radiation-emitting structural element according to claim 5, characterized in that
    the first partial surface of each lateral surface merges into the corresponding second partial surface of the respective lateral surface at a distance d from the main surface.

8. Radiation-emitting structural element according to claim 7, characterized in that
    a border of the radiation-emitting surface is assigned to each transition from a first partial surface to a second partial surface of a lateral surface, which border is arranged at a distance l from an edge formed by the respective first partial surface and the main surface, for which distance the following applies:

$l > d/\tan\beta$, where $\beta = \arccos n_1/n_2$.

9. Radiation-emitting structural element according to claim 1 characterized in that
    a contact surface is provided on the multi-layer structure.

10. Radiation-emitting structural element according to claim 9, characterized in that
    a contact surface is provided on the side of the window opposite the multi-layer structure.

11. Radiation-emitting structural element according to claim 10, characterized in that
    the contact surface is structured in such a way that the shape of the contact surface corresponds to the shape of the radiation-emitting surface.

12. Radiation-emitting structural element according to claim 11, characterized in that
    the contact surface is structured by means of an etching process or a sputtering process.

13. Radiation-emitting structural element according to claim 9, characterized in that
    the multi-layer structure has at least one first layer of a first conductivity type and at least one second layer of a second conductivity type, wherein the active layer lies between the first and the second layer and/or is formed by portions of the first and the second layer, and the contact surface is applied to the first layer.

14. Radiation-emitting structural element according to claim 13, characterized in that
    the first layer is p-conducting and the second layer n-conducting, or the first layer is n-conducting and the second layer is p-conducting.

15. Radiation-emitting structural element according to claim 13, characterized in that
    to form the border of the radiation-emitting surface, the first layer is partially removed.

16. Radiation-emitting structural element according to claim 13, characterized in that to form the border of the radiation-emitting surface, only some portions of the first layer have conductivity of the first conductivity type.

17. Radiation-emitting structural element according to claim 9, characterized in that the contact surface has a hub area and a contact frame surface that is connected to the hub area.

18. Radiation-emitting structural element according to claim 1, characterized in that the multi-layer structure has lateral peripheral surfaces that are essentially perpendicular to the main surface and form, at least in part, the lateral border of the radiation-emitting surface.

19. Radiation-emitting structural element according to claim 18, characterized in that the lateral peripheral surfaces of the multi-layer structure are formed by means of an etching process.

20. Radiation-emitting structural element according to claim 1, characterized in that the multi-layer structure is manufactured epitaxially, and that the window is made of a substrate used for epitaxy.

21. Radiation-emitting structural element according to claim 20, characterized in that the window contains SiC.

22. Radiation-emitting structural element according to claim 20, characterized in that the window contains GaN.

23. Radiation-emitting structural element according to claim 1, characterized in that the multi-layer structure contains at least one of the compounds GaN, AlGaN, InGaN, or AlInGaN.

24. Radiation-emitting structural element according to claim 1, characterized in that it is a luminescent diode.

25. Radiation-emitting structural element according to claim 3, wherein the profile of the window parallel to the main surface has the shape of a right angle triangle.

26. Radiation-emitting structural element according to claim 3, wherein the profile of the window parallel to the main surface has the shape of an equilateral triangle.

* * * * *

UNITED STATES PATENT AND TRADEMARK OFFICE
CERTIFICATE OF CORRECTION

PATENT NO.    : 6,768,136 B2  
DATED         : July 27, 2004  
INVENTOR(S)   : Dominik Eisert et al.

It is certified that error appears in the above-identified patent and that said Letters Patent is hereby corrected as shown below:

<u>Column 9,</u>  
Line 53, replace ">" with -- $\geq$ --

<u>Column 10,</u>  
Line 33, replace ">" with -- $\geq$ --

Signed and Sealed this

Seventeenth Day of May, 2005

JON W. DUDAS  
*Director of the United States Patent and Trademark Office*